(12) United States Patent
Shin et al.

(10) Patent No.: US 7,930,619 B2
(45) Date of Patent: Apr. 19, 2011

(54) APPARATUS AND METHOD FOR ENCODING LOW DENSITY PARITY CHECK CODES IN A COMMUNICATION SYSTEM

(75) Inventors: Dong-Joon Shin, Seoul (KR);
Yong-Chun Piao, Seoul (KR)

(73) Assignees: Samsung Electronics CO., Ltd. (KR);
Seoul National University Industry Foundation (KR)

( * ) Notice: Subject to any disclaimer, the term of this patent is extended or adjusted under 35 U.S.C. 154(b) by 1027 days.

(21) Appl. No.: 11/789,966

(22) Filed: Apr. 26, 2007

(65) Prior Publication Data

US 2008/0270872 A1    Oct. 30, 2008

(30) Foreign Application Priority Data

Apr. 20, 2007   (KR) ................. 10-2007-0038599

(51) Int. Cl.
*H03M 13/03* (2006.01)
(52) U.S. Cl. ...................... 714/790; 714/758
(58) Field of Classification Search .............. 714/790, 714/758
See application file for complete search history.

(56) References Cited

U.S. PATENT DOCUMENTS

| | | | |
|---|---|---|---|
| 6,633,856 B2* | 10/2003 | Richardson et al. | 706/15 |
| 6,789,227 B2* | 9/2004 | De Souza et al. | 714/804 |
| 6,895,547 B2* | 5/2005 | Eleftheriou et al. | 714/801 |
| 7,502,987 B2 | 3/2009 | Kyung et al. | |
| 7,523,375 B2* | 4/2009 | Spencer | 714/752 |
| 2003/0014718 A1* | 1/2003 | De Souza et al. | 714/804 |
| 2004/0034828 A1* | 2/2004 | Hocevar | 714/800 |
| 2005/0229091 A1* | 10/2005 | Narayanan et al. | 714/801 |

FOREIGN PATENT DOCUMENTS

| | | |
|---|---|---|
| KR | 1020050118056 | 12/2005 |
| KR | 1020050119596 | 12/2005 |

OTHER PUBLICATIONS

Myung, S. et. al., "Quasi-Cyclic LDPC Codes for Fast Encoding" Aug. 2005, IEEE, vol. 51 No. 8, pp. 2894-2901.*

* cited by examiner

*Primary Examiner* — M. Mujtaba K Chaudry
(74) *Attorney, Agent, or Firm* — The Farrell Law Firm, P.C.

(57) ABSTRACT

A Low Density Parity Check (LDPC) code encoding apparatus for a communication system is provided. The encoding apparatus receives information bits, and generates an LDPC code by encoding the information bits using an interleaving scheme. The interleaving scheme is generated such that when the LDPC code is punctured, there is no short-length cycle in a Tanner graph of the punctured LDPC code.

12 Claims, 5 Drawing Sheets

(a) TANNER GRAPH OF PUNCTURED RA CODE (b) CHECK NODE-MERGED TANNER GRAPH (a) TANNER GRAPH OF PUNCTURED RA CODE

||| EQUIVALENT (b) CHECK NODE-MERGED TANNER GRAPH

US 7,930,619 B2

APPARATUS AND METHOD FOR ENCODING LOW DENSITY PARITY CHECK CODES IN A COMMUNICATION SYSTEM

PRIORITY

This application claims priority under 35 U.S.C. §119(a) to a Korean Patent Application filed in the Korean Intellectual Property Office on Apr. 20, 2007 and assigned Serial No. 2007-38599, the disclosure of which is incorporated herein by reference.

BACKGROUND OF THE INVENTION

1. Field of the Invention

The present invention relates generally to a communication system, and in particular, to an apparatus and method for encoding Low Density Parity Check (LDPC) codes in a communication system.

2. Description of the Related Art

The next generation communication system is developed to support high-speed, high-capacity data transmission/reception for Mobile Stations (MSs). Particularly, in the next generation communication system, various schemes such as Hybrid Automatic Repeat reQuest (HARQ) and Adaptive Modulation and Coding (AMC) have been proposed for support of high-speed, high-capacity data transmission/reception, and the communication system should support various coding rates to use the HARQ and AMC schemes.

In addition, the next generation communication system considers using LDPC codes as well as turbo codes. LDPC codes are known to show high performance gain during high-speed data transmission, and can effectively correct errors caused by noises generated in a transmission channel, thereby contributing to an increase in reliability of data transmission. LDPC codes can be classified into Repeat Accumulate (RA) codes and Concatenated ZigZag (CZZ) codes. The RA codes are subclassified into regular RA codes and irregular RA codes, and the CZZ codes are subclassified into regular CZZ codes and irregular CZZ codes.

As described above, to use the HARQ and AMC schemes, the communication system should support various coding rates. There are various proposed schemes for supporting the various coding rates, and the typical one of the schemes is a puncturing scheme of supporting various coding rates using one catch-all codeword.

However, when the communication system using LDPC codes supports various coding rates using the puncturing scheme, an increase in puncturing rate causes degradation in performance of the LDPC codes. This is because the cycle structure on a Tanner graph of the LDPC code changes due to the use of the puncturing scheme. The term 'cycle' as used herein refers to a loop formed by edges connecting information nodes to check nodes in the Tanner graph of the LDPC code, and a length of the cycle is defined as the number of edges constituting the loop.

Therefore, there is a need for a Low Density Parity Check (LDPC) code encoding scheme for preventing performance degradation while using the puncturing scheme.

SUMMARY OF THE INVENTION

An aspect of the present invention is to address at least the problems and/or disadvantages identified above and to provide at least the advantages described below. Accordingly, an aspect of the present invention is to provide an apparatus and method for encoding LDPC codes in a communication system.

Another aspect of the present invention is to provide an apparatus and method for encoding LDPC codes in a communication system using a puncturing scheme.

According to one aspect of the present invention, there is provided an encoding apparatus of a Low Density Parity Check (LDPC) code for a communication system. The apparatus includes an LDPC code encoder for receiving information bits, and generating an LDPC code by encoding the information bits using an interleaving scheme, wherein the interleaving scheme is generated such that when the LDPC code is punctured, there is no short-length cycle in a Tanner graph of the punctured LDPC code.

According to another aspect of the present invention, there is provided a method for encoding a Low Density Parity Check (LDPC) code in an encoding apparatus of an LDPC code for a communication system. The method includes receiving information bits; and generating an LDPC code by encoding the information bits using an interleaving scheme; wherein the interleaving scheme is generated such that when the LDPC code is punctured, there is no short-length cycle in a Tanner graph of the punctured LDPC code.

BRIEF DESCRIPTION OF THE DRAWINGS

The above and other aspects, features and advantages of the present invention will become more apparent from the following detailed description when taken in conjunction with the accompanying drawings in which.

DETAILED DESCRIPTION OF PREFERRED EMBODIMENTS

Preferred embodiments of the present invention will now be described in detail with reference to the annexed drawings. In the following description, detailed description of known functions and configurations incorporated herein has been omitted for clarity and conciseness.

The present invention provides an apparatus and method for encoding Low Density Parity Check (LDPC) codes in a communication system. In particular, the present invention provides an apparatus and method for encoding LDPC codes taking into account the possible use of a puncturing scheme in a communication system. The LDPC codes can be classified into Repeat Accumulate (RA) codes and Concatenated Zig-Zag (CZZ) codes. The RA codes are subclassified into regular RA codes and irregular RA codes, and the CZZ codes are subclassified into regular CZZ codes and irregular CZZ codes. Although the apparatus and method for encoding LDPC codes will be described herein with reference to the regular RA codes, the irregular RA codes, the regular CZZ codes and the irregular CZZ codes, by way of example, the LDPC encoding apparatus and method proposed by the present invention can be applied to other codes as well as the regular RA codes, the irregular RA codes, the regular CZZ codes and the irregular CZZ codes.

Figure 1:
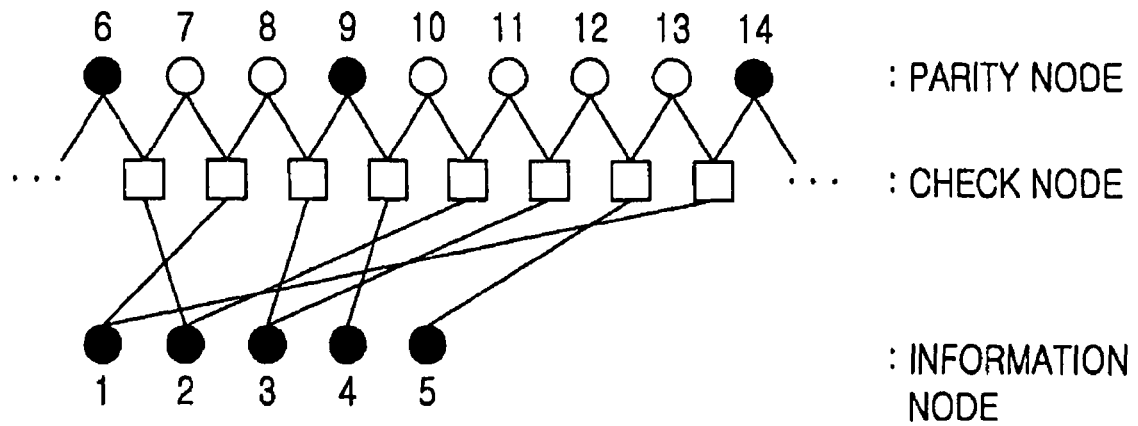
FIG. 1 is a Tanner graph of a punctured Repeat Accumulate (RA) code and its equivalent Tanner graph according to the present invention.
Figure 1:
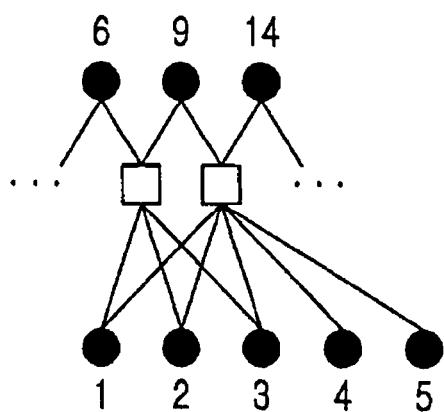

Before a description of FIG. 1 is given, it is noted that a Tanner graph of a punctured RA code is equivalent to a check node-merged Tanner graph. That is, when punctured parity nodes in the Tanner graph of the punctured RA code are removed and check nodes are merged, the check node-merged Tanner graph is generated.

Referring to FIG. 1, when check nodes connected to degree-2 parity nodes punctured in the Tanner graph of the punctured RA code shown in (a) are combined, the check node-merged Tanner graph shown in (b) is generated. That is, as shown in (a), in the Tanner graph of the punctured RA code, if parity nodes 7, 8, 10, 11, 12 and 13, as they are punctured parity nodes, are punctured and check nodes are merged, a check node-merged Tanner graph having parity nodes 6, 9 and 14 is generated as shown in (b).

Therefore, when a signal reception apparatus decodes a punctured RA code transmitted by a signal transmission apparatus, the signal reception apparatus can decode the punctured RA code using the check node-merged Tanner graph rather than the Tanner graph of the punctured RA code. The use of the check node-merged Tanner graph instead of the Tanner graph of the punctured RA code for decoding of the punctured RA code increases the convergence rate of decoding and decreases the number of calculations, contributing to a reduction in the entire decoding complexity of the signal reception apparatus.

It is assumed in FIG. 1 that the puncturing pattern is $(d_1, d_2, \ldots, d_k)$, where $d_i$ denotes the distance between an $i^{th}$ unpunctured parity node and an $(i+1)^{th}$ unpunctured parity node. In addition, as shown in (a) of FIG. 1, it is assumed that the puncturing pattern of the Tanner graph of the punctured RA code is (3,5). For convenience, it is assumed herein that an embodiment of the present invention uses only a regular puncturing pattern d. The term 'regular puncturing pattern' as used herein refers to a puncturing pattern in which a distance between unpunctured parity nodes is regular. The reason for assuming that the embodiment of the present invention uses only the regular puncturing pattern d is because the regular puncturing pattern shows the optimal performance when check node degrees are almost similar.

A description will now be made of a cycle structure of punctured regular RA code, irregular RA code, regular CZZ code, and irregular CZZ code.

Figure 2:
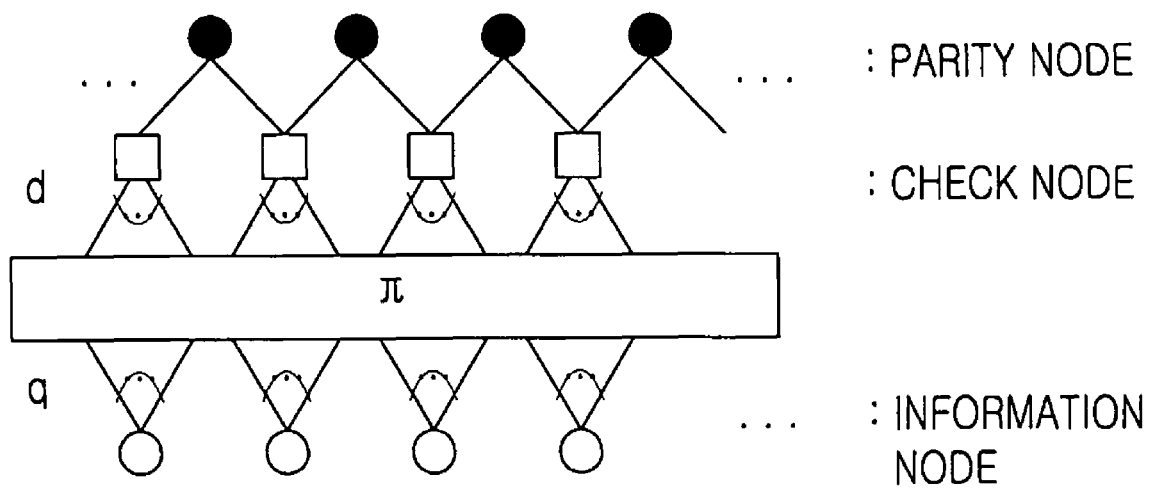
FIG. 2 is a check node-merged Tanner graph of a (qL,L)-RA code punctured using a regular puncturing pattern according to the present invention.

With reference to FIG. 2, the description will first be made of a cycle structure of a punctured RA code.

Before a description of FIG. 2 is given, it is noted that the (qL,L)-RA code indicates an RA code having L information bits and qL codeword bits. Herein, q denotes the number of repetitions for the L information bits and qL denotes the size of an interleaver.

Referring to FIG. 2, $\pi$ indicates an interleaver, and interleaver $\pi$ indicates permutation from $Z_{qL}$ having $Z_{qL}$ that becomes an integer by modulo qL, to the $Z_{qL}$. Generally, in an irregular RA code, degrees of information nodes are not a constant q, and its cyclical structure is similar to the cyclical structure of a regular RA code.

A description will now be made of a length-6 cycle structure of the punctured RA code. For convenience, to calculate the absolute value of $\pi(x)-\pi(y)$, the $\pi(x)$ and $\pi(y)$ are regarded as normal integers, even though $\pi(x)$ and $\pi(y)$ are calculated by a modulo-qL operation.

(1) Length-2 Cycle Structure

The necessary condition for the existence of a length-2 cycle structure in the Tanner graph of the punctured RA code can be expressed as Equation (1).

$$|\pi(x)-\pi(y)|<d \quad (1)$$

In Equation (1), $nq \leq x \neq y < (n+1)q$ for $n \in \{0, 1, \ldots, L-1\}$ (2) Length-4 Cycle Structure A length-4 cycle structure in the Tanner graph of the punctured RA code is roughly classified into two types: Type-I and Type-II, and the necessary condition for existence of the length-4 cycle structure can be expressed as Equation (2).

Type-I: $|\pi(x)-\pi(y)|<d$ and $|\pi(x')-\pi(y')|<d$,

Type-II: $|\pi(x)-\pi(x')|<2d \quad (2)$

In Equation (2), $nq \leq x \neq x' < (n+1)q$ and $mq \leq y \neq y' < (m+1)q$ for $n \neq m \in \{0, 1, \ldots, L-1\}$.

(3) Length-6 Cycle Structure

A length-6 cycle structure in the Tanner graph of the punctured RA code is roughly classified into three types: Type-I, Type-II and Type-III, and the necessary condition for existence of the length-6 cycle structure can be expressed as Equation (3).

Type-I: $|\pi(x)-\pi(y)|<d$, $|\pi(y)-\pi(z)|<d$, and $|\pi(z)-\pi(x)|<d$,

Type-II: $|\pi(x)-\pi(y)|<d$ and $|\pi(x')-\pi(y')|<2d$,

Type-III: $|\pi(x)-\pi(x')|<3d \quad (3)$

In Equation (3), $nq \leq x \neq x' < (n+1)q$, $mq \leq y \neq y' < (m+1)q$ and $kq \leq z < (k+1)q$ for $n \neq m \neq k \in \{0, 1, \ldots, L-1\}$.

Figure 3:
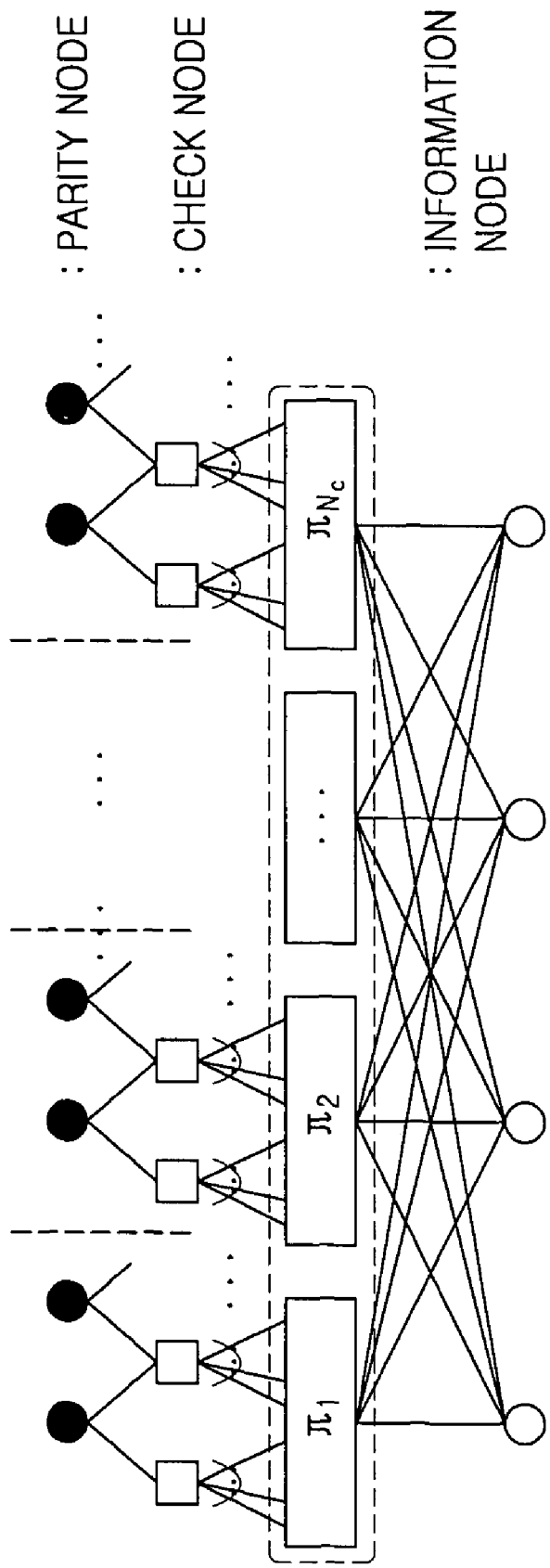
FIG. 3 is a check node-merged Tanner graph of a ($N_c$, d+2)-CZZ code punctured using a regular puncturing pattern according to the present invention.

With reference to FIG. 3, a description will now be made of a cycle structure of a punctured regular CZZ code and a punctured irregular CZZ code.

Before a description of FIG. 3 is given, it is noted that $N_c$ denotes the number of component zigzag codes included in the $(N_c, d+2)$-CZZ code, and d+2 denotes a check node degree.

Referring to FIG. 3, $\pi_i$ indicates an interleaver for an $i^{th}$ zigzag code, and the interleaver $\pi_i$ indicates permutation from $Z_i$ to $Z_L$, where L denotes the number of information bits, and $1 \leq i \leq L$.

A description will now be made of a length-6 cycle structure of the CZZ code.

For the CZZ code, there is no parallel edge between information nodes and check nodes. Therefore, for a punctured CZZ code, there is no length-2 cycle in its Tanner graph.

(1) Length-4 Cycle Structure

The necessary condition for existence of a length-4 cycle structure in the Tanner graph of the punctured CZZ code can be expressed as Equation (4).

$$|\pi_i(x)-\pi_i(y)|<d \text{ and } |\pi_j(x)-\pi_j(y)|<d \quad (4)$$

In Equation (4), $i \neq j$ and $x \neq y \in \{0, 1, \ldots, L-1\}$.

(2) Length-6 Cycle Structure

A length-6 cycle structure in the Tanner graph of the punctured CZZ code is roughly classified into two types: Type-I and Type-II, and the necessary condition for existence of the length-6 cycle structure can be expressed as Equation (5).

$$\text{Type I: } |\pi_i(x)-\pi_i(y)|<d, |\pi_j(y)-\pi_j(z)|<d, \text{ and } |\pi_k(x)-\pi_k(z)|<d,$$

$$\text{Type II: } |\pi_i(x)-\pi_i(y)|<2d \text{ and } |\pi_j(x)-\pi_j(y)|<d \quad (5)$$

In Equation (5), $i \neq j \neq k$ and $x \neq y \neq z \in \{0, 1, \ldots, L-1\}$.

An interleaver serves as an important factor for determining performance of the LDPC code. Therefore, an embodiment of the present invention will design a polynomial interleaver that can remove short-length cycles from a Tanner graph of a finite-length RA LDPC code punctured using Theorem 1-1, Theorem 1-2 and Theorem 2.

Theorem 1-1

The necessary and sufficient conditions in which a polynomial $\pi(x)$ is a degree-k permutation polynomial over an integer ring $Z_{p^n}$ are satisfied when the polynomial $\pi(x)$ is a permutation polynomial over $Z(p)$ and $\pi'(x) \neq 0 \mod p$ for all integers $x \in Z_{p^n}$.

Theorem 1-2

The necessary and sufficient conditions in which a polynomial $\pi(x)$ is a permutation polynomial over modulo N for any integer $N=\Pi_{i=1}^m p_i^{n_i}$ (where $p_i$'s are distinct prime numbers) are satisfied when the polynomial $\pi(x)$ is a permutation polynomial over $p_i^{n_i}$ for all i.

Theorem 2

If $d>1$ is a divisor of $k-1$, there is no degree-d permutation polynomial $\pi(x)$.

For convenience, it is assumed herein that $N=qL$.

A description will first be made of an operation of designing interleavers of a punctured regular RA code and a punctured irregular. RA code.

Assume that $N=qL$, where $L=p^n$ and p denotes a prime number. Then, it is possible to design a length-N polynomial interleaver for a $(q \times p^n, p^n)$-RA code using Theorem 1-1 and Theorem 1-2. Fact 1 below indicates Theorem 1-1 and Theorem 1-2 for $p=2$ and $q=2^m$.

Fact 1

For a $(2^m \times 2^n, 2^n)$-RA code, $\pi(x)=a_k x^k + a_{k-1} x^{k-1} + \ldots + a_1 x + a_0 \mod (2^m \times 2^n)$ can be an interleaver if $a_k \neq 0$, $a_1$ is odd, $a_2 + a_4 + \ldots$ is even, and $a_3 + a_5 + \ldots$ is even.

Using Fact 1, an interleaver of a RA code can be designed as follows.

(1) If there is no solution to Equation (1), the interleaver $\pi$ can avoid length-2 cycles.

(2) If there is no common solution to Equation (2), the interleaver $\pi$ can avoid Type-I and Type-II length-4 cycles.

(3) If there is no common solution to Equation (3), the interleaver $\pi$ can avoid Type-I, Type-II and Type-III length-6 cycles.

In order to remove length-2 cycles in a Tanner graph of a punctured RA code, assuming that $\Lambda=\{|\pi(i)-\pi(j)| \| x \leq i \neq j \leq x+q-1, x \in \{0, q, \ldots, (L-1) \times q\}\}$, an interleaver $\pi$ is designed such that there is no solution to Equation (1). That is, length-2 cycles are removed when the interleaver $\pi$ is designed such that $\Lambda \cap \{1, 2, \ldots, d-1\}=\phi$.

When interleavers of a punctured regular RA code and a punctured irregular RA code are designed in the foregoing manner, the length-2, length-4 and length-6 cycles can be removed.

A description will now be made of an operation of designing interleavers of a punctured regular CZZ code and a punctured irregular CZZ code.

Fact 2 is defined as follows.

Fact 2

$\pi_i(x)=a_k x^k + a_{k-1} x^{k-1} + \ldots + a_1 x + a_0 \mod L$ (where $1 \leq i \leq N_c$) can be an interleaver for a CZZ code when $\pi_i(x)$ is a permutation polynomial modulo L for all i.

Using Fact 2, an interleaver of a CZZ code can be designed as follows.

(1) If there is no common solution to Equation (4) for all $i \neq j$, $\pi_0, \pi_1, \ldots, \pi_{N_c-1}$ can avoid length-4 cycles.

(2) If there is no common solution to Equation (5) for all $i \neq j \neq k$, $\pi_0, \pi_1, \ldots, \pi_{N_c-1}$ can avoid Type-I and Type-II length-4 cycles.

In order to remove length-4 cycles in the Tanner graph of the punctured CZZ code, assume that $\Lambda_i=\{|\pi_i(x)-\pi_i(y)| \| 0 \leq x \neq y < L\}$ and $\Lambda_j=\{|\pi_j(x)-\pi_j(y)| \| 0 \leq x \neq y < L\}$. Thereafter, an interleaver $\pi_i$ and an interleaver $\pi_j$ are designed such that there are solutions to Equation (4). That is, the length-4 cycles are removed when the interleaver $\pi_i$ and the interleaver $\pi_j$ are designed such that $\Lambda_i$ and $\Lambda_j$ are disjointed for the same pair (x,y).

When interleavers of the punctured regular CZZ code and the punctured irregular CZZ code are designed in the foregoing manner, the length-4 and length-6 cycles can be removed.

Figure 4:
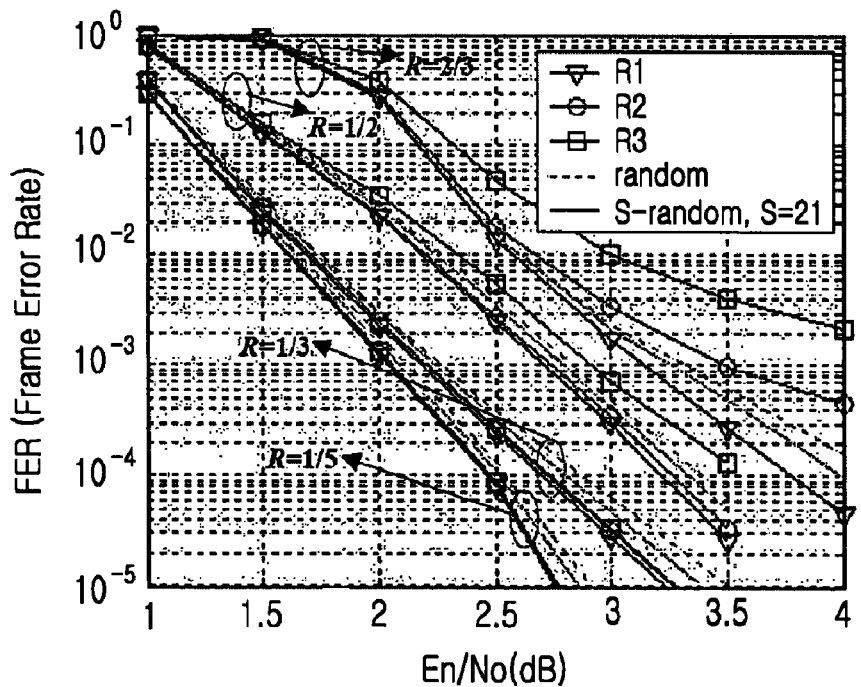
FIG. 4 is a graph illustrating performance of a punctured systematic (4096,1024)-RA code using various interleavers according to the present invention.

With reference to FIG. 4, a description will now be made of performance of a punctured systematic (4096,1024)-RA code using various interleavers according to an embodiment of the present invention.

Before a description of FIG. 4 is given, it is noted that a coding rate of a (4096,1024)-RA code, which is a catchall codeword, is 1/5; when the (4096,1024)-RA code is punctured using a puncturing pattern 2, the coding rate is 1/3; when the (4096,1024)-RA code is punctured using a puncturing pattern 4, the coding rate is 1/2; and when the (4096,1024)-RA code is punctured using a puncturing pattern 8, the coding rate is 2/3. For convenience, the (4096,1024)-RA code punctured using the puncturing pattern 2 will be referred to as a 'first punctured RA code', the (4096,1024)-RA code punctured using the puncturing pattern 4 will be referred to as a 'second punctured RA code', and the (4096,1024)-RA code punctured using the puncturing pattern 8 will be referred to as a 'third punctured RA code'.

In addition, when degree-2 polynomial interleavers are used for the (4096,1024)-RA code, first punctured RA code, second punctured RA code and third punctured RA code, lengths of the cycles included in Tanner graphs of the corresponding codes are shown in Table 1.

TABLE 1

| | Rate | | | |
|---|---|---|---|---|
| Interleaver | 1/5 | 1/3 | 1/2 | 2/3 |
| R1: $32x^2 + 15x + 1$ | 10 | 8 | 8 | 8 |
| R2: $40x^2 + 9x + 1$ | 10 | 6 | 6 | 4 |
| R3: $128x^2 + 63x + 1$ | 10 | 6 | 4 | 2 |

In Table 1, 'Rate' indicates coding rates, and R1, R2 and R3 indicate degree-2 polynomial interleavers. As shown in Table 1, even though any degree-2 polynomial interleaver is used for the (4096,1024)-RA code of coding rate 5/1, a girth included in the Tanner graph is 10. Herein, the girth indicates the minimum cycle length. Unlike this, for the first punctured RA code, second punctured RA code and third punctured RA code, the girth included in the corresponding Tanner graph can be 2, 4 or 6 according to the type of the degree-2 polynomial interleaver. That is, when degree-2 polynomial interleavers R2 and R3 are used for the first punctured RA code, the girth included in the Tanner graph is 6; when a degree-2 polynomial interleaver R3 is used for the second punctured RA code, the girth included in the Tanner graph is 4; and when a degree-2 polynomial interleaver R3 is used for the third punctured RA code, the girth included in the Tanner graph is 2.

Assume that Binary Phase Shift Keying (BPSK) is used as a modulation scheme, a Brief-Propagation (BP) algorithm is used, a maximum of 30 repetitions is used, and an Additive White Gaussian Noise (AWGN) channel environment is used.

In this case, as shown in FIG. 4, performance of the corresponding codes is optimized as compared with the use of a degree-2 polynomial interleaver R1, the use of a random interleaver, and the use of an S-random interleaver.

Figure 5:
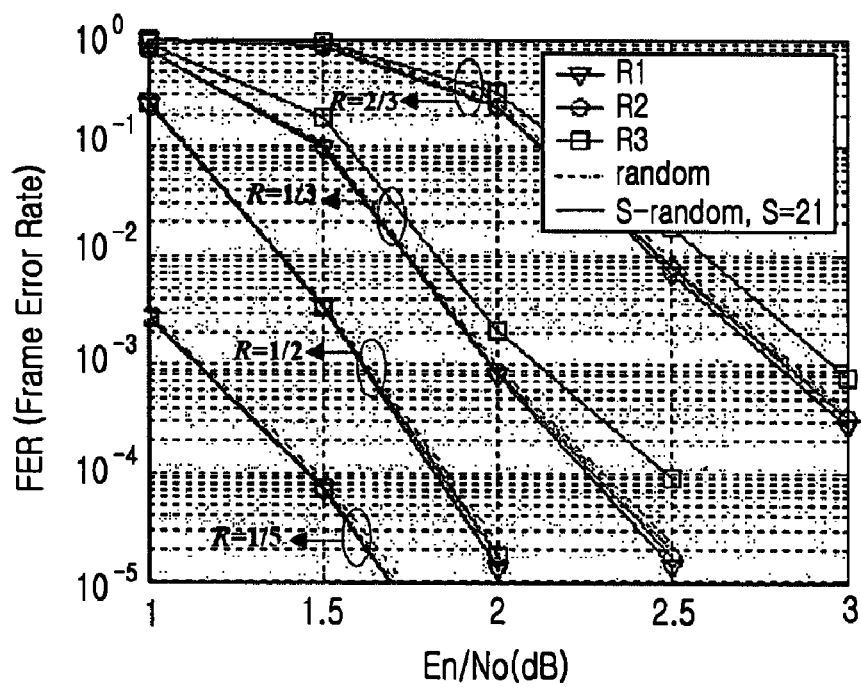
FIG. 5 is a graph illustrating performance of a punctured systematic (4,3)-CZZ code using various interleavers according to the present invention.

With reference to FIG. 5, a description will now be made of performance of a punctured systematic (4,3)-CZZ code using various interleavers according to an embodiment of the present invention.

Before a description of FIG. 5 is given, it is noted that a coding rate of a (4,3)-CZZ code, which is a catch-all codeword, is ⅕; when the (4,3)-CZZ code is punctured using a puncturing pattern 2, the coding rate is ⅓; when the (4,3)-CZZ code is punctured using a puncturing pattern 4, the coding rate is ½; and when (4,3)-CZZ code is punctured using a puncturing pattern 8, the coding rate is ⅔. It is assumed herein that the number L of information bits of the (4,3)-CZZ code is L=1000. For convenience, herein, the (4,3)-CZZ code punctured using the puncturing pattern 2 will be referred to as a 'first punctured CZZ code', the (4,3)-CZZ code punctured using the puncturing pattern 4 will be referred to as a 'second punctured CZZ code', and the (4,3)-CZZ code punctured using the puncturing pattern 8 will be referred to as a 'third punctured CZZ code'.

In addition, when degree-1 polynomial interleavers are used for the (4,3)-CZZ code, first punctured CZZ code, second punctured CZZ code and third punctured CZZ code, lengths of cycles included in Tanner graphs of the corresponding codes are shown in Table 2.

TABLE 2

| Interleaver | Rate | | | |
| --- | --- | --- | --- | --- |
|  | ⅕ | ⅓ | ½ | ⅔ |
| C1: 3x + 1, 11x + 1, 39x + 1, 141x + 1 | 10 | 8 | 8 | 8 |
| C2: 3x + 1, 11x + 1, 79x + 1, 109x + 1 | 10 | 8 | 6 | 6 |
| C3: x + 1, 3x + 1, 17x + 1, 19x + 1 | 10 | 6 | 4 | 4 |

In Table 2, 'Rate' indicates coding rates, and C1, C2 and C3 indicate degree-I polynomial interleavers. As shown in Table 2, even though any degree-1 polynomial interleaver is used for the (4,3)-CZZ code of coding rate ⅕, the girth included in the Tanner graph is 10. Unlike this, for first punctured CZZ code, second punctured CZZ code and third punctured CZZ code, the girth included in the corresponding Tanner graph can be 6 or 4 according to the type of the degree-1 polynomial interleaver. That is, when the degree-1 polynomial interleaver C3 is used for the first punctured CZZ code, the girth included in the Tanner graph is 6; when the degree-1 polynomial interleaver C3 is used for the second punctured CZZ code, the girth included in the Tanner graph is 4; and when the degree-1 polynomial interleaver R3 is used for the third punctured CZZ code, the girth included in the Tanner graph is 4.

Similarly, assume that BPSK is used as a modulation scheme, a BP algorithm is used, a maximum of 30 repetitions is used, and an AWGN channel environment is used.

In this case, as shown in FIG. 5, performance of the corresponding codes is optimized as compared with the use of a degree-1 polynomial interleaver C1, the use of a random interleaver, and the use of an S-random interleaver.

A description has been made of an operation of designing interleavers such that there is no short-length cycle in the Tanner graphs of the punctured RA code and the punctured CZZ code. The performance is optimized by designing interleavers in the foregoing manner, encoding RA codes and CZZ codes with the designed interleavers, and decoding the RA codes and CZZ codes according thereto.

Figure 6:
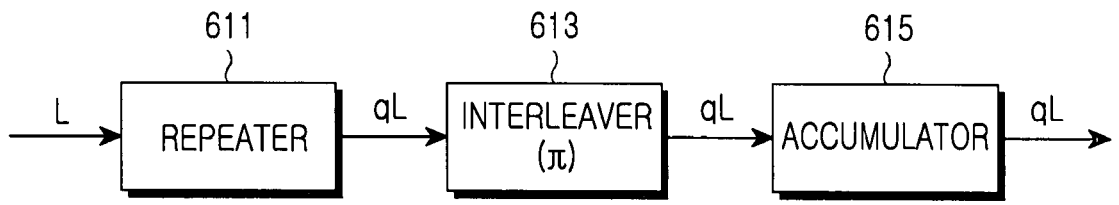
FIG. 6 is a block diagram illustrating the internal structure of an encoder for an RA code according to the present invention.

With reference to FIG. 6, a description will now be made of an internal structure of an encoder for an RA code according to an embodiment of the present invention.

Referring to FIG. 6, the encoder for an RA code includes a repeater 611, an interleaver 613, and an accumulator 615. Length-L information bits are input to repeater 611, and repeater 611 repeats the length-L information bits 'q' times, where 'q' is a predetermined number of repetitions, and outputs the repetition result to interleaver 613. Interleaver 613 interleaves the signal output from repeater 611 using a predetermined interleaving scheme, and outputs the interleaving result to accumulator 615. Herein, interleaver 613 is designed in the manner described with reference to FIG. 3. Accumulator 615 accumulates the signal output from interleaver 613 and generates an RA code.

Figure 7:
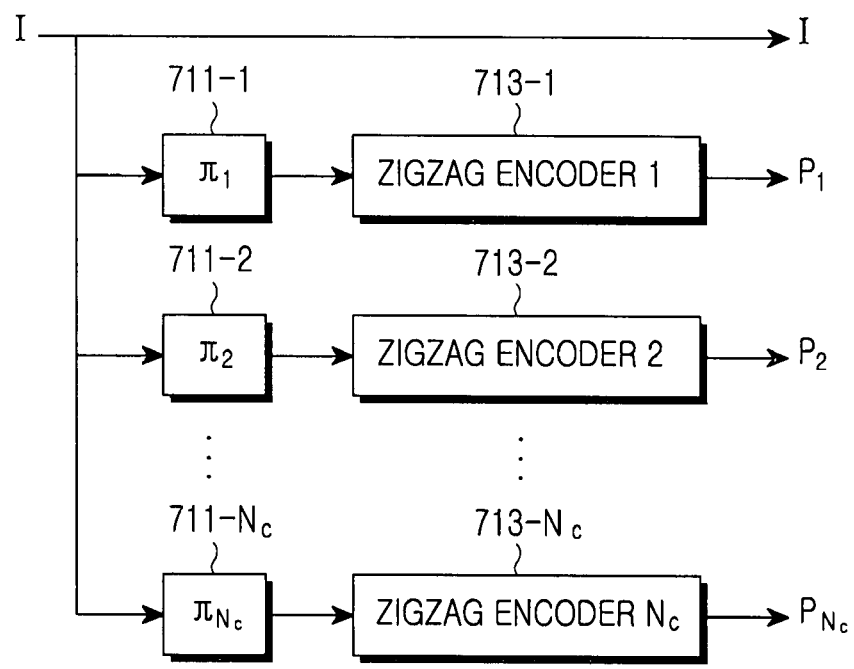
FIG. 7 is a block diagram illustrating the internal structure of an encoder for a CZZ code according to the present invention.

With reference to FIG. 7, a description will now be made of an internal structure of an encoder for a CZZ code according to an embodiment of the present invention.

Referring to FIG. 7, the encoder for a CZZ code includes $N_c$ interleavers of an interleaver $\pi_1$ 711-1, an interleaver $\pi_2$ 711-2, ..., an interleaver $\pi_{N_c}$ 711-$N_c$, and $N_c$ zigzag encoders of a zigzag encoder #1 713-1, a zigzag encoder #2 713-2, ..., a zigzag encoder #$N_C$ 713-$N_c$.

Input length-L information bits are intactly generated as an information vector I, and are also input to each of the $N_c$ interleavers. Each of the $N_c$ interleavers interleaves the length-L information bits according to a predetermined interleaving scheme, and outputs the interleaving result to its associated zigzag encoder. Herein, the $N_c$ interleavers each are designed in the manner described with reference to FIG. 4.

Each of the $N_c$ zigzag encoders encodes the signal output from its associated interleaver using a zigzag coding scheme, and outputs a parity vector. Herein, a parity vector output from the zigzag encoder #1 713-1 is a parity vector #1 $P_1$, a parity vector output from the zigzag encoder #2 713-2 is a parity vector #2 $P_2$, and a parity vector output from the zigzag encoder #$N_C$ 713-$N_C$ is a parity vector #$N_C$ $P_{N_C}$.

As is apparent from the foregoing description, the present invention designs interleavers taking into account the possible use of the puncturing scheme in the communication system, thereby avoiding existence of short-length cycles in the Tanner graph of the punctured LDPC code. As a result, the present invention designs interleavers such that there is no short-length cycle in the Tanner graph, thereby contributing to an increase in performance of the punctured LDPC codes.

While the invention has been shown and described with reference to a certain preferred embodiment thereof, it will be understood by those skilled in the art that various changes in form and details may be made therein without departing from the spirit and scope of the invention as further defined by the appended claims.

What is claimed is:

1. A method for encoding a Low Density Parity Check (LDPC) code in an LDPC code encoding apparatus for a communication system, the method comprising:
   receiving information bits; and
   generating an LDPC code by encoding the information bits using an interleaving scheme;
   wherein the interleaving scheme is generated such that when the LDPC code is punctured, there is no short-length cycle in a Tanner graph of the punctured LDPC code.

2. The method of claim 1, wherein when the LDPC code is a $(2^m \times 2^n, 2^n)$-Repeat Accumulate (RA) code, the interleaving scheme is $\pi(x)=a_k x^k + a_{k-1} x^{k-1} + \ldots + a_1 x + a_0 \mod (2^m \times 2^n)$,
   where $a_1$ is odd, $a_2+a_4+\ldots$ is even, and $a_3+a_5+\ldots$ is even, and
   wherein if there is no solution to the following Equation, there is no length-2 cycle in a Tanner graph of the $(2^m 2^n, 2^n)$ RA code:

$$|\pi(x)-\pi(y)|<d$$

where $nq \leq x \neq y < (n+1)q$ for $n \in \{0, 1, \ldots, L-1\}$, wherein $q=2^m$, $p=2$, L denotes the number of information bits of the $(2^m \times 2^n, 2^n)$-RA code, and d denotes a distance between unpunctured parity bits when the $(2^m \times 2^n, 2^n)$-RA code is punctured according to a regular puncturing pattern.

3. The method of claim 1, wherein when the LDPC code is a $(2^m 2^n, 2^n)$-RA code, the interleaving scheme is $\pi(x)=a_k x^k + a_{k-1} x^{k-1} + \ldots + a_1 x + a_0 \mod (2^m \times 2^n)$,
   where $a_1$ is odd, $a_2+a_4+\ldots$ is even, and $a_3+a_5+\ldots$ is even, and
   wherein if there is no common solution to the following Equation, there is no length-4 cycle in a Tanner graph of the $(2^m \times 2^n, 2^n)$-RA code:

Type-I: $|\pi(x)-\pi(y)|<d$ and $|\pi(x')-\pi(y')|<d$,

Type-II: $|\pi(x)-\pi(x')|<2d$ where $nq \leq x \neq x' < (n+1)q$ and $mq \leq y \neq y' < (m+1)q$ for $n \neq m \in \{0, 1, \ldots, L-1\}$,
   wherein $q=2^m$, $p=2$, L denotes the number of information bits of the $(2^m \times 2^n, 2^n)$-RA code, Type-I and Type-II indicate types of the length-4 cycle structure, and d denotes a distance between unpunctured parity bits when the $(2^m \times 2^n, 2^n)$-RA code is punctured according to a regular puncturing pattern.

4. The method of claim 1, wherein when the LDPC code is a $(2^m 2^n, 2^n)$-RA code, the interleaving scheme is $\pi(x)=a_k x^k + a_{k-1} x^{k-1} + \ldots + a_1 x + a_0 \mod (2^m \times 2^n)$,
   where $a_1$ is odd, $a_2+a_4+\ldots$ is even, and $a_3+a_5+\ldots$ is even, and
   wherein if there is no common solution of the following equation, there is no length-6 cycle in a Tanner graph of the $(2^m \times 2^n, 2^n)$-RA code:

Type-I: $|\pi(x)-\pi(y)|<d$, $|\pi(y)-\pi(z)|<d$, and $|\pi(z)-\pi(x)|<d$,

Type-III: $|\pi(x)-\pi(y)|<d$ and $|\pi(x')-\pi(y')|<2d$,

Type-III: $|\pi(x)-\pi(x')|<3d$ where $nq \leq x \neq x' < (n+1)q$, $mq \leq y \neq y' < (m+1)q$ and $kq \leq z < (k+1)q$ for $n \neq m \neq k \in \{0, 1, \ldots, L-1\}$, wherein $q=2^m$, $p=2$, L denotes the number of information bits of the $(2^m \times 2^n, 2^n)$-RA code, Type-I, Type-II and Type-III indicate types of the length-6 cycle structure, and d denotes a distance between unpunctured parity bits when the $(2^m \times 2^n, 2^n)$-RA code is punctured according to a regular puncturing pattern.

5. The method of claim 1, wherein if the LDPC code is a Concatenated ZigZag (CZZ) code, the interleaving scheme is $\pi_i(x)=a_k x^k + a_{k-1} x^{k-1} + \ldots + a_1 x + a_0 \mod L$ for $1 \leq i \leq L$, and the interleaving scheme $\pi_i(x)$ is permutation polynomial modulo L for all i,
   wherein if there is no solution to the following Equation, there is no length-4 cycle in a Tanner graph of the CZZ code:

$$|\pi_i(x)-\pi_i(y)|<d \text{ and } |\pi_j(x)-\pi_j(y)|<d$$

where $i \neq j$, $x \neq y \in \{0, 1, \ldots, L-1\}$, L denotes the number of information bits of the CZZ code, $N_c$ denotes the number of component zigzag codes included in the CZZ code, and d denotes a distance between unpunctured parity bits when the CZZ code is punctured according to a regular puncturing pattern.

6. The method of claim 1, wherein if the LDPC code is a CZZ code, the interleaving scheme is $\pi_i(x)=a_k x^k + a_{k-1} x^{k-1} + \ldots + a_1 x + a_0 \mod L$ for $1 \leq i \leq L$, and the interleaving scheme $\pi_i(x)$ is permutation polynomial modulo L for all i, and wherein if there is no common solution to the following Equation, there is no length-6 cycle in a Tanner graph of the CZZ code:

Type I: $|\pi_i(x)-\pi_i(y)|<d$, $|\pi_j(y)-\pi_j(z)|<d$ and $|\pi_k(x)-\pi_k(z)|<d$, Type II: $|\pi_i(x)-\pi_i(y)|<2d$ and $|\pi_j(x)-\pi_j(y)|<d$ where $i \neq j \neq k$, $x \neq y \neq z \in \{0, 1, \ldots, L-1\}$, L denotes the number of information bits of the CZZ code, $N_c$ denotes the number of component zigzag codes included in the CZZ code, and d denotes a distance between unpunctured parity bits when the CZZ code is punctured according to a regular puncturing pattern.

7. An encoding apparatus of a Low Density Parity Check (LDPC) code for a communication system, the apparatus comprising:
   an LDPC code encoder for receiving information bits, and generating an LDPC code by encoding the information bits using an interleaving scheme;
   wherein the interleaving scheme is generated such that when the LDPC code is punctured, there is no short-length cycle in a Tanner graph of the punctured LDPC code.

8. The apparatus of claim 7, wherein when the LDPC code is a $(2^m \times 2^n, 2^n)$-Repeat Accumulate (RA) code, the interleaving scheme is $\pi(x)=a_k x^k + a_{k-1} x^{k-1} + \ldots + a_1 x + a_0 \mod (2^m \times 2^n)$,
   where $a_1$ is odd, $a_2+a_4+\ldots$ is even, and $a_3+a_5+\ldots$ is even, and
   wherein if there is no solution to the following Equation, there is no length-2 cycle in a Tanner graph of the $(2^m \times 2^n, 2^n)$-RA code:

$$|\pi(x)-\pi(y)|<d$$

where $nq \leq x \neq y < (n+1)q$ for $n \in \{0, 1, \ldots, L-1\}$, wherein $q=2^m$, $p=2$, L denotes the number of information bits of the $(2^m \times 2^n, 2^n)$-RA code, and d denotes a distance between unpunctured parity bits when the $(2^m \times 2^n, 2^n)$-RA code is punctured according to a regular puncturing pattern.

9. The apparatus of claim 7, wherein when the LDPC code is a $(2^m \times 2^n, 2^n)$-RA code, the interleaving scheme is $\pi(x)=a_k x^k + a_{k-1} x^{k-1} + \ldots + a_1 x + a_0 \mod (2^m \times 2^n)$,
   where $a_1$ is odd, $a_2+a_4+\ldots$ is even, and $a_3+a_5+\ldots$ is even, and wherein if there is no common solution to the following Equation, there is no length-4 cycle in a Tanner graph of the $(2^m \times 2^n, 2^n)$-RA code:

Type-I: $|\pi(x)-\pi(y)|<d$ and $|\pi(x')-\pi(y')|<d$,

Type-II: $|\pi(x)-\pi(x')|<2d$ where $nq \leq x \neq x' < (n+1)q$ and $mq \leq y \neq y' < (m+1)q$ for $n \neq m \in \{0, 1, \ldots, L-1\}$, wherein $q=2^m$, $p=2$, L denotes the number of information bits of the $(2^m \times 2^n, 2^n)$-RA code, Type-I and Type-II indicate types of the length-4 cycle structure, and d denotes a distance between unpunctured parity bits when the $(2^m \times 2^n, 2^n)$-RA code is punctured according to a regular puncturing pattern.

10. The apparatus of claim 7, wherein when the LDPC code is a $(2^m \times 2^n, 2^n)$-RA code, the interleaving scheme is $\pi(x) = a_k x^k + a_{k-1} x^{k-1} + \ldots + a_1 x + a_0 \mod (2^m \times 2^n)$, where $a_1$ is odd, $a_2+a_4+\ldots$ is even, and $a_3+a_5+\ldots$ is even, and wherein if there is no common solution of the following equation, there is no length-6 cycle in a Tanner graph of the $(2^m \times 2^n, 2^n)$-RA code:

Type-I: $|\pi(x)-\pi(y)|<d$, $|\pi(y)-\pi(z)|<d$, and $|\pi(z)-\pi(x)|<d$,

Type-II: $|\pi(x)-\pi(y)|<d$ and $|\pi(x')-\pi(y')|<2d$,

Type-III: $|\pi(x)-\pi(x')|<3d$ where $nq \leq x \neq x' < (n+1)q$, $mq \leq y \neq y' < (m+1)q$ and $kq \leq z < (k+1)q$ for $n \neq m \neq k \in \{0, 1, \ldots, L-1\}$, wherein $q=2^m$, $p=2$, L denotes the number of information bits of the $(2^m \times 2^n, 2^n)$-RA code, Type-I, Type-II and Type-III indicate types of the length-6 cycle structure, and d denotes a distance between unpunctured parity bits when the $(2^m \times 2^n, 2^n)$-RA code is punctured according to a regular puncturing pattern.

11. The apparatus of claim 7, wherein if the LDPC code is a Concatenated ZigZag (CZZ) code, the interleaving scheme is $\pi_i(x) = a_k x^k + a_{k-1} x^{k-1} + \ldots + a_1 x + a_0 \mod L$ for $1 \leq i \leq L$, and the interleaving scheme $\pi_i(x)$ is permutation polynomial modulo L for all i, and wherein if there is no solution to the following Equation, there is no length-4 cycle in a Tanner graph of the CZZ code:

$|\pi_i(x)-\pi_i(y)|<d$ and $|\pi_j(x)-\pi_j(y)|<d$ where $i \neq j$, $x \neq y \in \{0, 1, \ldots, L-1\}$, L denotes the number of information bits of the CZZ code, $N_c$ denotes the number of component zigzag codes included in the CZZ code, and d denotes a distance between unpunctured parity bits when the CZZ code is punctured according to a regular puncturing pattern.

12. The apparatus of claim 7, wherein if the LDPC code is a CZZ code, the interleaving scheme is $\pi_i(x) = a_k x^k + a_{k-1} x^{k-1} + \ldots + a_1 x + a_0 \mod L$ for $1 \leq i \leq L$, and the interleaving scheme $\pi_i(x)$ is permutation polynomial modulo L for all i, and wherein if there is no common solution to the following Equation, there is no length-6 cycle in a Tanner graph of the CZZ code:

Type I: $|\pi_i(x)-\pi_i(y)|<d$, $|\pi_j(y)-\pi_j(z)|<d$, and $|\pi_k(x)-\pi_k(z)|<d$, Type II: $|\pi_i(x)-\pi_i(y)|<2d$ and $|\pi_j(x)-\pi_j(y)|<d$ where $i \neq j \neq k$, $x \neq y \neq z \in \{0, 1, \ldots, L-1\}$, L denotes the number of information bits of the CZZ code, $N_c$ denotes the number of component zigzag codes included in the CZZ code, and d denotes a distance between unpunctured parity bits when the CZZ code is punctured according to a regular puncturing pattern.

* * * * *